US010056282B2

(12) United States Patent
Xu

(10) Patent No.: US 10,056,282 B2
(45) Date of Patent: Aug. 21, 2018

(54) METHOD AND SYSTEM OF ROBOT FORK CALIBRATION AND WAFER PICK-AND-PLACE

(71) Applicant: BEIJING NAURA MICROELECTRONICS EQUIPMENT CO., LTD., Beijing (CN)

(72) Inventor: Dong Xu, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 134 days.

(21) Appl. No.: 15/281,110

(22) Filed: Sep. 30, 2016

(65) Prior Publication Data

US 2017/0194183 A1    Jul. 6, 2017

(30) Foreign Application Priority Data

Dec. 31, 2015  (CN) .......................... 2015 1 1021465
Dec. 31, 2015  (CN) .......................... 2015 1 1022412
Dec. 31, 2015  (CN) .......................... 2015 1 1023889

(51) Int. Cl.

| G05B 19/04  | (2006.01) |
| H01L 21/677 | (2006.01) |
| H01L 21/67  | (2006.01) |
| H01L 21/68  | (2006.01) |
| B25J 9/16   | (2006.01) |

(52) U.S. Cl.
CPC ...... *H01L 21/67766* (2013.01); *B25J 9/1692* (2013.01); *H01L 21/67259* (2013.01); *H01L 21/68* (2013.01)

(58) Field of Classification Search
CPC ............... H01L 21/67766; H01L 21/68; H01L 21/67259; B25J 9/1692
See application file for complete search history.

(56) References Cited

U.S. PATENT DOCUMENTS

| 6,215,127 B1* | 4/2001 | Yu ....................... G03F 7/70625 250/398 |
| 6,343,242 B1* | 1/2002 | Nomura ................ B25J 9/1676 318/568.11 |
| 6,345,209 B1* | 2/2002 | Yu ....................... G03F 7/70516 430/5 |
| 6,345,211 B1* | 2/2002 | Yu ....................... G03F 7/70516 430/5 |
| 6,360,144 B1* | 3/2002 | Bacchi .................... B25J 9/042 414/744.3 |

* cited by examiner

*Primary Examiner* — Mingjen Jen
(74) *Attorney, Agent, or Firm* — Tianchen LLC

(57) ABSTRACT

A robot fork calibration method and system is provided. At least three non-linear arranged lower sensors are provided on a bottom surface of the fork to detect distances to a fixed detection point. The fixed detection point and a horizontal plane of the detection point define a reference coordinate system. Spatial coordinates of the lower sensors in the reference coordinate system are calculated and a plane equation as well as a tilted angle of the fork are obtained according to the spatial coordinates. Therefore, the height of the fork can be calibrated according to the Z axis coordinates of the lower sensors and the levelness of the fork can be calibrated according to the tilted angle.

20 Claims, 5 Drawing Sheets

METHOD AND SYSTEM OF ROBOT FORK CALIBRATION AND WAFER PICK-AND-PLACE

CROSS-REFERENCE TO RELATED APPLICATION

The application is related to and claims the priority benefit of Chinese Patent Application Serial No. 201511021465.6, filed Dec. 31, 2015, Chinese Patent Application Serial No. 201511022412.6, filed Dec. 31, 2015, and Chinese Patent Application Serial No. 201511023889.6, filed Dec. 31, 2015; the entirety of each of the above-mentioned patent applications is hereby incorporated by reference herein and made a part of the specification.

FIELD OF THE INVENTION

The present invention generally relates to the field of semiconductor manufacturing equipment, more particularly, to methods and systems of robot fork calibration and wafer pick-and-place.

BACKGROUND OF THE INVENTION

Safe wafer pick-and-place is a very important technical indicator for integrated circuit production lines. Generally, the breakage rate of wafers due to wafer handling equipment in the course of production should be less than 0.001%. Compared with a single-wafer processing system, a batch-type wafer heat treatment system requires more wafer transfer and pick-and-place operations in each production process, which makes higher demands of safe and reliable wafer transfer and pick-and-place.

Nowadays, robots have been widely applied in the field of semiconductor IC manufacturing technology and have become important tools in wafer handling systems for picking, placing and transferring unprocessed and processed wafers. The robot can response to instructions to accurate move to a point of wafer location in a three-dimensional or two-dimensional space to pick and place wafers.

Currently, the positional parameters of the robot during handling a wafer in the batch-type wafer heat treatment equipment are generally obtained by offline teaching. The offline teaching data of the positional parameters are usually stored in a memory and calibrated periodically. The robot uses its fork to perform the pick-and-place operation to the wafers located in a wafer carrier according to the stored offline teaching data. However, factors such as robot fork rotation or positional offset may cause collision of the robot fork with the wafer or wafer carrier when the robot performs the pick-and-place operation, resulting in irreparable losses such as damages to the wafer or equipment.

Accordingly, in order to perform the wafer pick-and-place operation, an accurate pose recognition for the robot fork is required, such that proper measures can be taken to the fork which is in the abnormal condition to ensure a safe pick-and-place operation.

BRIEF SUMMARY OF THE DISCLOSURE

In order to overcome the drawbacks mentioned above, the present invention provides a robot fork calibration method and system, which can fast and accurate detect the height and levelness state of the robot fork, so as to ensure a safe wafer pick-and-place operation.

According to one aspect of the present invention, a robot fork calibration method is provided, wherein the fork is used for picking up and placing a target wafer in a wafer carrier and is mounted on a fixed base station. The method comprises the following steps:

Step S1: setting a detection point on a horizontal upper surface of the base station and establishing a reference coordinate system in which the detection point is the zero point, the horizontal upper surface is the XOY plane;

Step S2: providing at least three non-linear arranged lower sensors on a bottom surface of the fork or a bottom surface of a dummy wafer fixed on the fork at regions uncovered by the fork for detecting distances to the detection point;

Step S3: programming the robot in accordance with offline teaching data including a sequence of waypoints which define a pick-up operation path or a place operation path of the target wafer;

Step S4: driving the robot to move along the pick-up operation path or the place operation path of the target wafer, wherein at each waypoint, acquiring spatial coordinates of the lower sensors in the reference coordinate system according to detection results from the lower sensors and then calculating a plane equation of the fork and a tilted angle of the fork according to the spatial coordinates of the lower sensors;

Step S5: calibrating a height of the fork according to vertical distances between the lower sensors and the horizontal upper surface and calibrating a levelness of the fork according to the tilted angle of the fork.

According to another aspect of the present invention, a robot fork calibration system is provided. The fork is used for picking up and placing a target wafer in a wafer carrier and is mounted on a fixed base station. The system comprises at least three non-linear arranged lower sensors on a bottom surface of the fork or a bottom surface of a dummy wafer fixed on the fork at regions uncovered by the fork for detecting distances to a detection point on a horizontal upper surface of the base station, a store module storing offline teaching data including a sequence of waypoints which define a pick-up operation path or a place operation path of the target wafer, a drive module driving the robot to move along the pick-up operation path or the place operation path of the target wafer and driving the lower sensors to detect when the robot arrives at each waypoint; a calculate module calculating spatial coordinates of the lower sensors in a reference coordinate system in which the detection point is the zero point and the horizontal upper surface is the XOY plane according to detection results from the lower sensors and then calculating a plane equation of the fork and a tilted angle of the fork according to the spatial coordinates of the lower sensors; a control module controlling the drive module to calibrate a height of the fork according to vertical distances between the lower sensors and the horizontal upper surface and a levelness of the fork according to the tilted angle of the fork.

According to another aspect of the present invention, a wafer pick-and-place system for picking up and placing a target wafer in a wafer carrier is provided. The system comprises a robot having a fork mounted on a fixed base station. The fork is provided with at least three non-linear arranged upper sensors on its top surface for detecting distances to the target wafer during the wafer pick-and-place operation and at least three non-linear arranged lower sensors on its bottom surface for detecting distances to a detection point on a horizontal upper surface of the base station. The system also comprises a store module storing offline teaching data including a sequence of waypoints which define a pick-up operation path or a place operation path of the target wafer, a drive module driving the robot to move along the pick-up operation path or the place operation path of the target wafer and driving the upper and lower sensors to detect; a calculate module calculating spatial coordinates of the lower sensors in a reference coordinate system in which the detection point is the zero point and the horizontal upper surface is the XOY plane according to detection results from the lower sensors and then calculating a plane equation of the fork and a tilted angle of the fork according to the spatial coordinates of the lower sensors; a control module controlling the drive module to calibrate a height of the fork according to vertical distances between the lower sensors and the horizontal upper surface and a levelness of the fork according to the tilted angle of the fork.

According to the present invention, a reference coordinate system is established in which a detection point on an horizontal upper surface of the robot base station is set as a zero point and the horizontal upper surface is set as the XOY plane, and the tilted angle of the fork as well as the fork height can be calculated according to the detection by the lower sensors disposed on the bottom surface of the fork during the motion of the robot, so as to monitor the fork pose and calibrate the height and levelness of the fork in time. Therefore, wafer damages due to unexpected collision between the fork and the wafer can be avoided, and wafer handling safety can be improved. Furthermore, during the actual wafer pick-and-place operation, the pose of the target wafer can be recognized on the basis of the calibrated robot fork, so as to avoid wafer slippery or wafer collision with the fork.

DETAILED DESCRIPTION OF THE EMBODIMENTS

Reference will now be made in detail to the present preferred embodiments to provide a further understanding of the invention. The specific embodiments and the accompanying drawings discussed are merely illustrative of specific ways to make and use the invention, and do not limit the scope of the invention or the appended claims.

Figure 1:
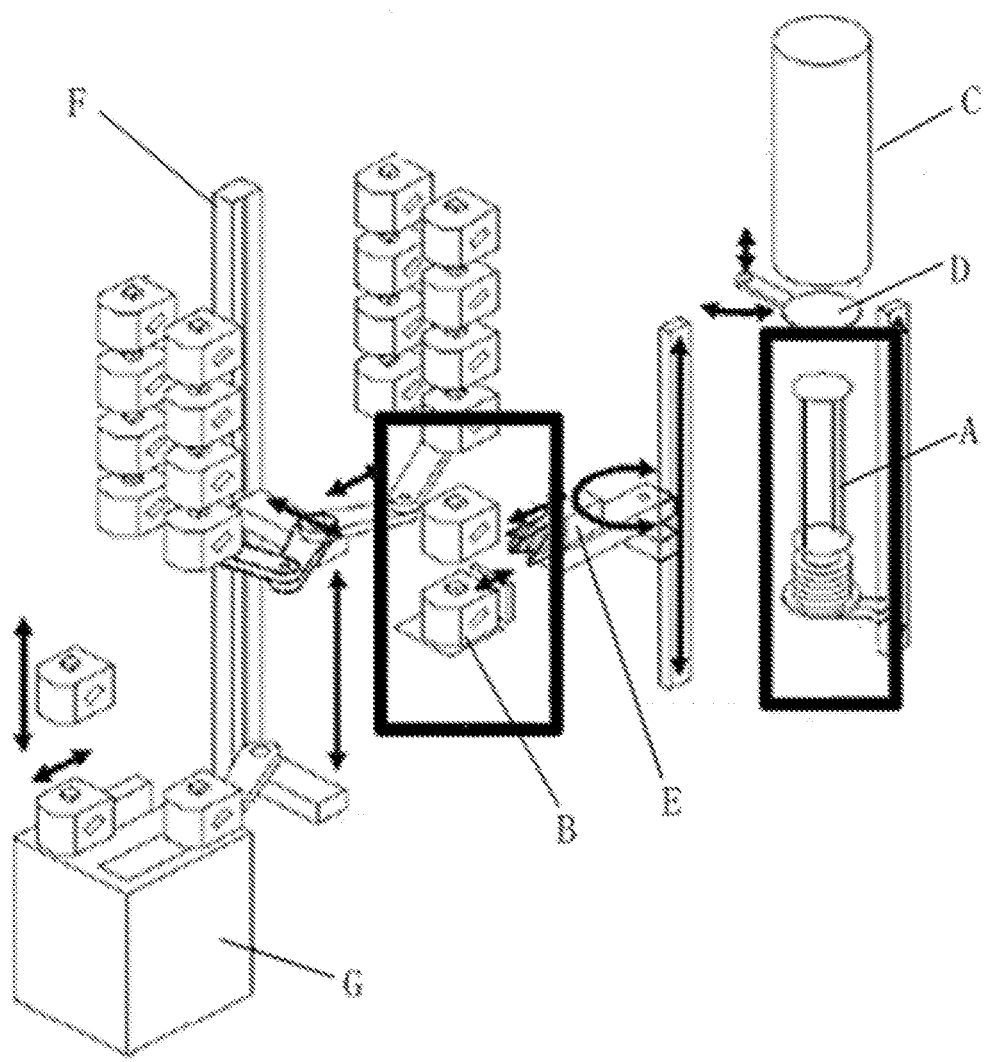
FIG. 1 is a view illustrating different wafer carriers in the semiconductor equipment according to an embodiment of the present invention.

The semiconductor equipment of the present invention includes a wafer carrier which supports multiple wafers and a robot which performs the wafer pick-and-up operation. The wafer carrier has supporters on which the wafers are horizontally positioned in a vertical stack. As shown in FIG. 1, in an embodiment of the present invention, the wafer carrier can be a front-opening unified pod (FOUP) B which stores the wafers. It can also be a wafer boat A which loads the wafers into a reaction chamber C. The semiconductor equipment further has a FOUP holder F for holding the FOUPs B, which is connected to a pedestal G. During wafer handling, the robot E picks up the wafers from the FOUP B and places them on the wafer boat A. After the wafers being loaded into the wafer boat, a furnace door D at the bottom of the reaction chamber C is opened and the wafer boat A carrying the wafers is ascended into the reaction chamber C. When the reaction is completed, the furnace door D is opened, the wafer boat A carrying the processed wafer is descended from the bottom of the reaction chamber C, and then the robot E picks up the wafers from the wafer boat A and places them into the FOUP B. Wherein, the movement directions of the components A, B, D, E mentioned above are indicated by arrows as shown in FIG. 1. Therefore, as for the wafer pick-up operation of the present invention, the wafers are taken out from either the FOUP or the wafer boat. Similarly, as for the wafer place operation, the wafers are placed into either the FOUP or the wafer boat.

In order to perform safe wafer pick-and-place operation, the pose of the robot fork should be calibrated. The robot fork calibration method and system according to the present invention will be described in details hereinafter in conjunction with FIGS. 2-7 and embodiments. The figures referred to above are in simplified forms and not necessarily drawn to scale, should be understood to provide a representation of particular embodiments of the invention, and are merely conceptual in nature and illustrative of the principle involved.

Figure 2:
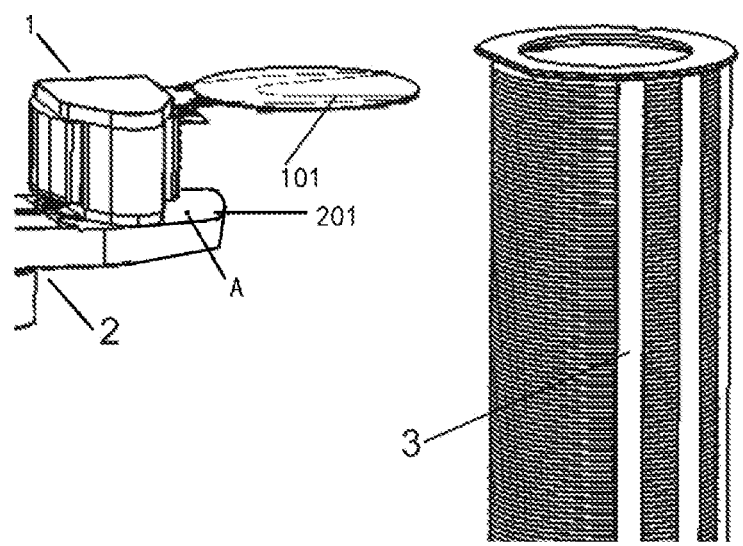
FIG. 2 is a view illustrating positions of the robot fork and the robot base station according to an embodiment of the present invention.
Figure 3:
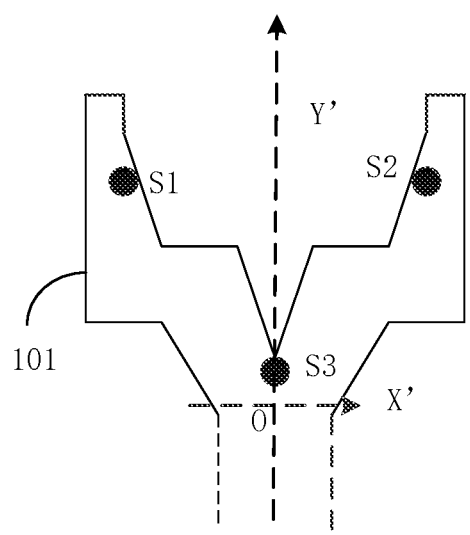
FIG. 3 is a bottom view illustrating the robot fork according to an embodiment of the present invention.

Referring to FIG. 2 and FIG. 3, in the embodiment, the wafer carrier is a wafer boat including a plurality of (for example, three) supporting columns 3 which are separated from and in parallel to each other in the semi-circumference of the wafer W, and supporters arranged on each of the columns at a predetermined vertical interval extending inward for holding edge portions of the wafers from below. The fork 101 of the robot 1 is mounted on a fixed robot base station 2, for picking up and placing a target wafer in the wafer carrier. Herein, the term "target wafer" refers to a wafer to be picked-up or to be placed by the robot. In the embodiment, a detection point A is set on a horizontal upper surface 201 of the base station, so as to establish a reference coordinate system in which the detection point A is set as the zero point and the horizontal upper surface 201 is set as the XOY plane.

The fork 101 is a V-shaped fork which can be rotated around a first axis as well as a second axis vertical to the first axis in the same plane. Accordingly, as for the fork 101, another local coordinate system can be established in which the first axis is set as the Y' axis, the second axis is set as the X' axis and the fork plane is set as the X'OY' plane. In the embodiment, the Y' axis is a symmetric axis extending a length direction of the fork which coincides with a bisector of the wafer W. The largest distance between outer sides of two wings of the V-shaped fork is less than a diameter of the wafer W. The fork can also have a gripper for clamping the wafer more stably.

Figure 5:
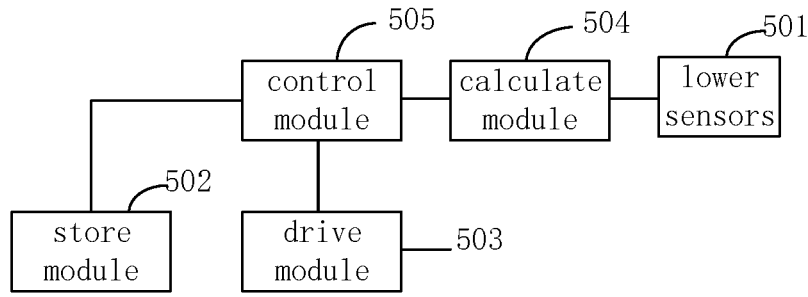
FIG. 5 is a block diagram of the robot fork calibration system according to an embodiment of the present invention.

As shown in FIG. 5, the robot fork calibration system according to the present embodiment comprises: at least three non-linear arranged lower sensors 501 fixed on a bottom surface of the fork, a store module 502, a drive module 503, a calculate module 504, and a control module 505.

Figure 4A:
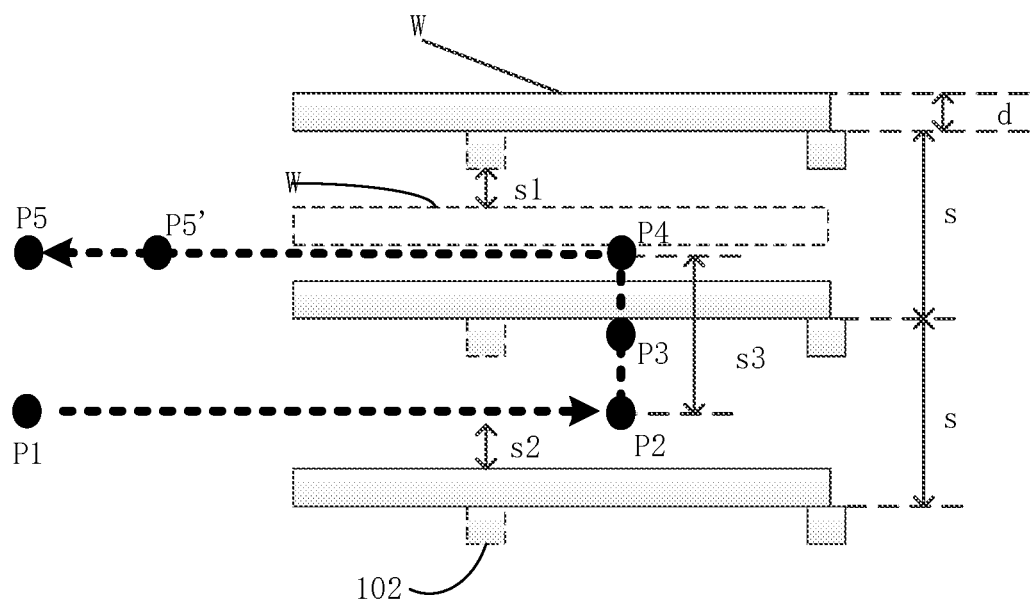
FIG. 4a is a view illustrating a wafer pick-up path according to an embodiment of the present invention.

The store module 502 stores offline teaching data which teaches the motion of the robot. The offline teaching data includes a sequence of waypoints which define an operation path for the robot corresponding to the target wafer. FIG. 4a is a view illustrating the pick-up operation path of the target wafer. According to the embodiment, the robot performs the wafer pick-up operation along a pick-up operation path as represented by the thick dotted line of FIG. 4a passing through five waypoints P1-P5 successively. Herein, the waypoint P1 represents a first position at which the robot is ready to enter into the wafer carrier, the waypoint P2 represents a second position right below the target wafer at which the robot is ready to touch the target wafer. The waypoints P1 and P2 are in the same level at a height of "S2" relative to the plane of an underlying wafer, the distance between the waypoint P1 and the wafer carrier is preferably to be greater than twice the vertical interval "S" between the supporters. The waypoint P3 represents a third position at which the robot touches the target wafer and picks it up from the wafer carrier, the waypoint P4 represents a fourth position right above the third position P3 at which the robot holds the target wafer and is ready to leave the wafer carrier, the waypoint P5 represents a fifth position outside the wafer carrier at which the robot finishes the pick-up operation. The distance between the waypoint P5 and the wafer carrier is preferably to be greater than twice the vertical interval "S" between the supporters. The waypoints P4 and P5 are in the same level at a height of "S3" relative to the waypoints P1 and P2 where the distance between the target wafer hold thereon and an above supporter is "S1". The store module stores the above positions of the waypoints P1-P5, the parameters S1, S2 and S3, as well as other offline teaching data including the thickness "d" of the target wafer, the vertical interval "S" between the supporters, and the thickness "t" of the supporter. The offline teaching data stored in the store module teaches the robot to perform the pick-up operation as follows: firstly, the robot moves horizontally from the initial position of the waypoint P1 to the waypoint P2, then moves vertically upward to the waypoint P3 and picks up the target wafer, the robot continues to move upward with the target wafer to the waypoint P4, and finally moves horizontally from the waypoint P4 the end position of the waypoint P5. Preferably, the stored offline teaching data also teaches the robot to clamp the target wafer with its gripper at the waypoint P5' when the robot moves horizontally from the waypoint P4 towards the waypoint P5.

Figure 4B:
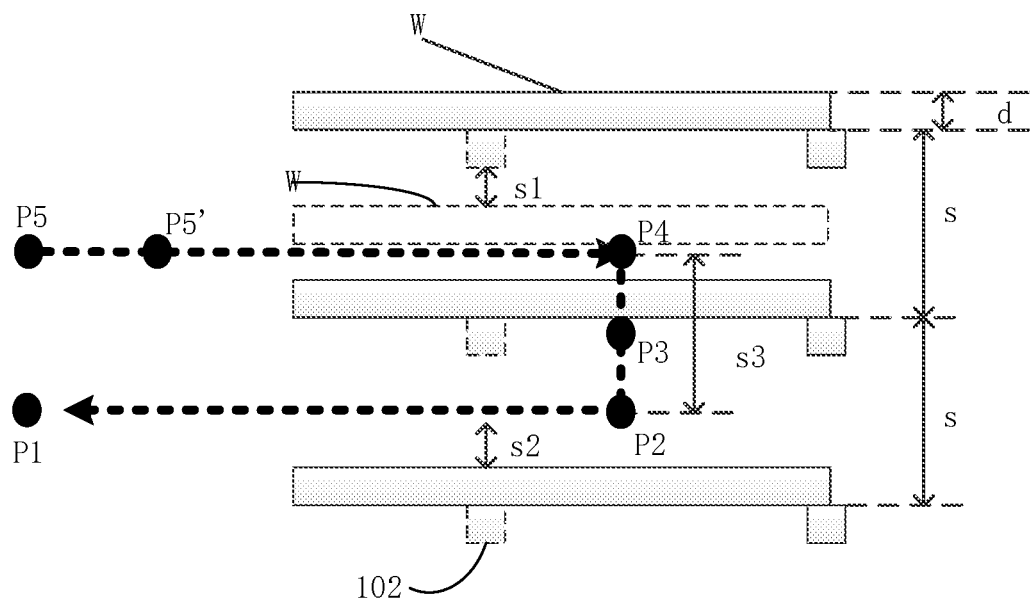
FIG. 4b is a view illustrating a wafer place path according to an embodiment of the present invention.

FIG. 4b is a view illustrating the place operation of the target wafer. According to the embodiment, the robot performs the wafer place operation along a place operation path as represented by the thick dotted line of FIG. 4b passing through five waypoints P5-P1 successively. The place operation path is opposite to the pick-and-place path. Herein, the waypoint P5 represents a first position at which the robot carrying the target wafer is ready to enter into the wafer carrier, the waypoint P4 represents a second position right above a target position for accommodating the target wafer at which the robot is ready to place the target wafer. The distance between the waypoint P5 and the wafer carrier is preferably to be greater than twice the vertical interval "S" between the supporters. The waypoints P4 and P5 are in the same level at a height that the distance between the target wafer and an adjacent above supporter is "S1". The waypoint P3 represents a third position at which the robot places the target wafer on the supporters, the waypoint P2 represents a fourth position right below the third position P3 at which the robot is ready to leave the wafer carrier, the waypoint P1 represents a fifth position outside the wafer carrier at which the robot finishes the place operation. The waypoints P2 and P1 are in the same level at a height of "S2" relative to the plane of a wafer below the fork with a vertical distance of "S3" to the waypoints P5 and P4. The distance between the waypoint P1 and the wafer carrier is preferably to be greater than twice the vertical interval "S" between the supporters. The store module stores the above waypoints P5-P1, the parameters S1-S3 for the wafer place operation, as well as other offline teaching data including the thickness "d" of the target wafer, the vertical interval "S" between the supporters, and the thickness "t" of the supporter. Accordingly, the offline teaching data stored in the store module teaches the robot to perform the place operation as follows: firstly, the robot moves horizontally from the initial position of the waypoint P5 to the waypoint P4, then moves vertically downward to the waypoint P3 and places the target wafer on the supporters, the robot continues to move downward without the target wafer to the waypoint P2, and finally moves horizontally from the waypoint P2 to the end position of the waypoint P1. It is noted that, although in the embodiment, the positions of the waypoints P1 to P5 and the parameters of S1-S3 for the pick-up path and those for the place path are the same, they can also be different and respectively stored in the store module 502.

The drive module 503 drives the robot to move along the pick-up operation path or the place operation path of the target wafer and drives the lower sensors 501 to detect when the robot arrives at each waypoint of the operation path.

As shown in FIG. 3, the three lower sensors S1, S2, S3 (indicated by black spots) are arranged on the bottom surface of the fork 101. Herein, the sensors S1 and S2 are respectively arranged on the two symmetrical wings of the V-shaped fork 101 and the connection line of the sensors S1 and S2 is vertical to the Y' axis of the fork 101; the sensor S3 is arranged on a vertex of the V-shaped fork 101 near the zero point of the X'OY' plane. In other embodiment, when the robot fork is not suitable for mounting sensors, it can be provided with a dummy wafer on its top surface instead. In this case, the lower sensors can be fixed on a bottom surface of the dummy wafer at regions not covered by the fork. In the embodiment, the lower sensors S1-S3 are optical sensors which are driven by the drive module 503 to detect distances to the detection point A when the robot is positioned at the waypoint. Specifically, each of the optical sensors S1-S3 is capable to emit lights in different orientations, once a light emitted at a certain angle passes through the detection point, the optical sensor detects the distance to the detection point.

The calculate module 504 calculates the tilted angle of the fork relative to the horizontal upper surface of the base station. Specifically, since the distance between each sensor and the detection point as well as the direction of the light emitted by the sensor are both obtained, the calculate module 504 calculates the spatial coordinates of the three sensors in the reference coordinate system as $(x_1, y_1, z_1)$, $(x_2, y_2, z_2)$ and $(x_3, y_3, z_3)$. Based on these spatial coordinates $(x_1, y_1, z_1)$, $(x_2, y_2, z_2)$ and $(x_3, y_3, z_3)$, a plane equation of the fork can be acquired as: $aX+bY+cZ+d=0$; wherein, the terms a, b, c and d are calculated as follows:

$$a = y_1 z_2 - y_1 z_3 - y_2 z_1 + y_2 z_3 + y_3 z_1 - y_3 z_2;$$

$$b = -x_1 z_2 + x_1 z_3 + x_2 z_1 - x_2 z_3 - x_3 z_1 + x_3 z_2;$$

$$d = -x_1 y_2 z_3 + x_1 y_3 z_2 + x_2 y_1 z_3 - x_2 y_3 z_1 - x_3 y_1 z_2 + x_3 y_2 z_1.$$

Then, the angle θ between the X'OY' plane and the XOY plane, which is the tilted angle of the fork, meets the following equation:

$$\cos\theta = c/[\sqrt{(a^2+b^2+c^2)}]$$

$$\theta = \arccos(c/[\sqrt{(a^2+b^2+c^2)}]).$$

The control module 505 controls the drive module 503 to calibrate the height of the fork according to vertical distances from each sensor to the horizontal upper surface of the base station and controls the drive module 503 to calibrate the levelness of the fork according to the tilted angle θ and the spatial coordinates of the lower sensors.

To be specific, the control module 505 decides whether to calibrate the height of the fork by comparing the distance between each sensor and the horizontal upper surface with a first predetermined range. In the embodiment, the lower limit of the first predetermined range is D1, the upper limit is D2. The value D2 is preferred to be less than half of the height margin for the robot during the actual wafer pick-and-place operation. If all the vertical distances between the sensors and the horizontal upper surface are less than the lower limit D1 but larger than an allowable minimum height of the robot, the control module will not take any action. If at least one vertical distance is within the first predetermined range and all the vertical distances are less than the upper limit D2, the control module 505 controls the drive module 503 to calibrate the height of the fork. If at least one vertical distance exceeds the upper limit D2, the control module 505 decides to stop the robot and alert an alarm.

When the control module 505 decides to calibrate the fork height, it will send out a signal to the calculate module 504, the calculate module 504 responds to the signal to calculate a current average value of the distances between the sensors and the horizontal upper surface (that is, the heights of the sensors) at the current waypoint as Zave1=Average(z11,z21,z31), and further calculates a variation between the current average value Zave1 and a previous average value Zave0=Average(z10,z20,z30) corresponding to the same waypoint as Zave1−Zave0=Zchange. The control module 505 controls the drive module 503 to calibrate the current height of the fork according to the variation Zchange.

Preferably, while calibrating the fork height, the control module 505 also modifies the offline teaching data related to the height of the current waypoint which is stored in the store module 502. For example, the control module 505 modifies the parameter S2 to be S2'=S2−Zchange.

On the other hand, the control module 505 decides to calibrate the levelness of the robot fork by comparing the tilted angle of the fork relative to the horizontal upper surface with a second predetermined range. If the tilted angle exceeds the second predetermined range, the control module 505 will send out a signal to the drive module 503 to calibrate the levelness of the fork.

The levelness calibration for the robot fork will be described in detail as follow:

Firstly, the calculate module 504 calculates a rotation matrix which converts the local coordinate system into the reference coordinate system using unit quaternions according to the tilted angle θ, the fork plane equation of aX+bY+cZ+d=0 and the XOY plane equation of Z=0. The rotation matrix represented by unit quaternions is calculated as:

$$M(v, \theta) = \begin{bmatrix} \cos\theta + (1-\cos\theta)x^2 & (1-\cos\theta)xy - (\sin\theta)z & (1-\cos\theta)xz + (\sin\theta)y \\ (1-\cos\theta)yx + (\sin\theta)z & \cos\theta + (1-\cos\theta)y^2 & (1-\cos\theta)yz - (\sin\theta)x \\ (1-\cos\theta)zx - (\sin\theta)y & (1-\cos\theta)zy + (\sin\theta)x & \cos\theta + (1-\cos\theta)z^2 \end{bmatrix}$$

Wherein, x, y, z are vectors of an intersection line of the XOY plane and the X' OY' plane, that is, the cross product of the normal vector {a,b,c} of the X'OY' plane and the normal vector {0,0,1} of the XOY plane.

On the other hand, the rotation matrix can also be represented by Euler angles α, β, and γ (around the X', Y' Z' axis) as follow:

$$M(\alpha, \beta, \gamma) = \begin{bmatrix} \cos\alpha\cos\gamma - \cos\beta\sin\alpha\sin\gamma & -\cos\beta\cos\gamma\sin\alpha - \cos\alpha\sin\gamma & \sin\alpha\sin\beta \\ \cos\gamma\sin\alpha + \cos\alpha\cos\beta\sin\gamma & \cos\alpha\cos\beta\cos\gamma - \sin\alpha\sin\gamma & -\cos\alpha\sin\beta \\ \sin\beta\sin\gamma & \cos\gamma\sin\beta & \cos\beta \end{bmatrix}$$

Since M(v, θ)=M(α, β, γ), the calculate module 504 calculates the Euler angles α, β, and γ accordingly.

Then the control module 505 controls the drive module 503 to make the fork rotate around the X' axis by the angle of α, rotate around the Y' axis by the angle of β, and rotate around the Z' axis by the angle of γ, so as to return to the original level state.

Preferably, after the levelness calibration, the control module 505 again decides whether or not to calibrate the fork height. If yes, the control module 505 calibrates the fork height by the way as described above.

Figure 6:
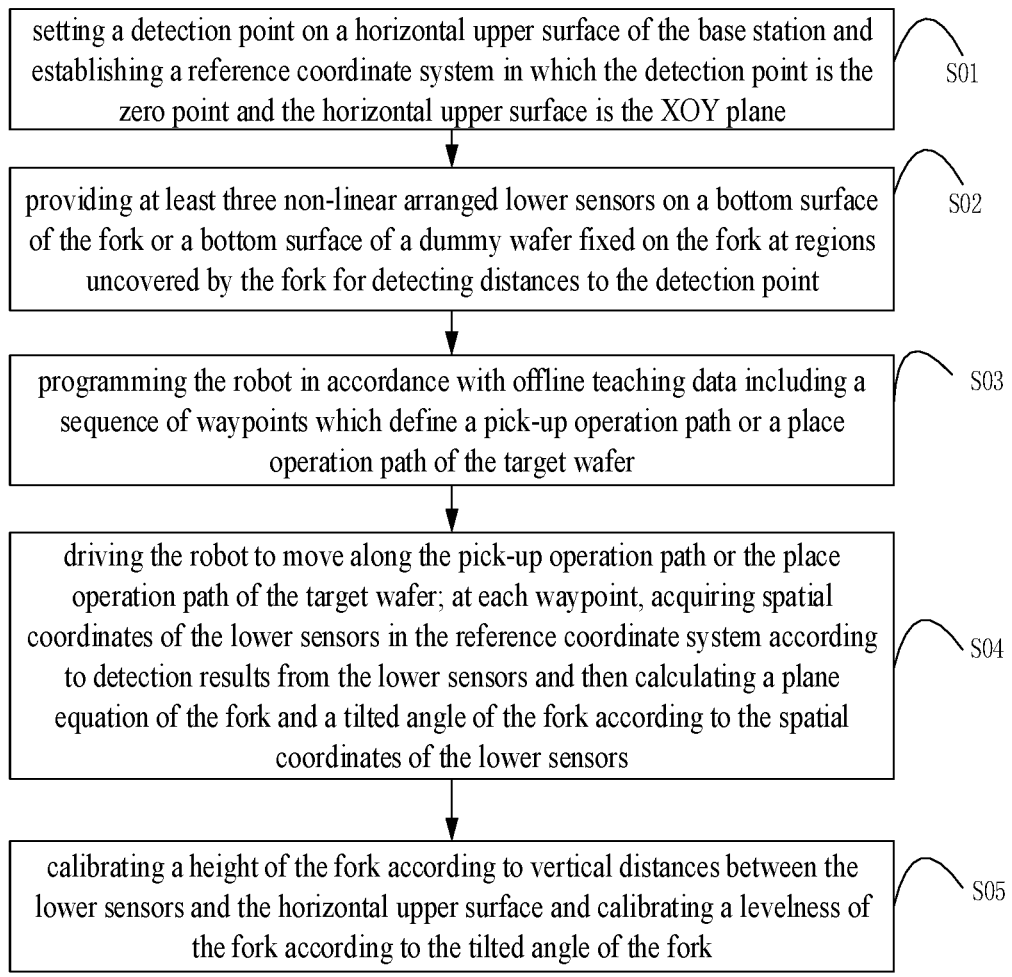
FIG. 6 is a flow chart illustrating the robot fork calibration method according to an embodiment of the present invention.

FIG. 6 is a flow chart illustrating a method of robot fork calibration according to the embodiment. The method comprises the following steps:

Step S1: setting a detection point on a horizontal upper surface of the base station and establishing a reference coordinate system in which the detection point is the zero point and the horizontal upper surface is the XOY plane;

Step S2: providing at least three non-linear arranged lower sensors on a bottom surface of the fork or a bottom surface of a dummy wafer fixed on the fork at regions uncovered by the fork for detecting distances to the detection point;

Step S3: programming the robot in accordance with offline teaching data including a sequence of waypoints which define a pick-up operation path or a place operation path of the target wafer;

Step S4: driving the robot to move along the pick-up operation path or the place operation path of the target wafer, wherein at each waypoint, acquiring spatial coordinates of the lower sensors in the reference coordinate system according to detection results from the lower sensors and then calculating a plane equation of the fork and a tilted angle of the fork according to the spatial coordinates of the lower sensors;

Step S5: calibrating a height of the fork according to vertical distances between the lower sensors and the horizontal upper surface and calibrating a levelness of the fork according to the tilted angle of the fork.

The above method can be performed off-line before the actual wafer pick-and-place operation, or it can be performed on-line during the actual pick-and-place operation. For example, during the pick-and-place operation, when the robot arrives at a certain waypoint, the system calibrates the height and levelness of the fork, and then the robot begins to move to a next waypoint.

In some embodiments of the present invention, after the fork pose calibration during the wafer pick-and-place operation, the wafer pose is also calibrated on the basis of the calibrated fork.

Specifically, the sensors S1-S3 are fixed on the bottom surface of the robot fork without using the dummy wafer. Furthermore, at least three non-linear arranged upper sensors are fixed on a top surface of the fork. When the robot fork is calibrated to be level, these upper sensors can detect the distance between the fork to the target wafer before picking up or after placing the target wafer. Then, a plane equation of the target wafer can be calculated and the pose recognition of the target wafer can be implemented.

Figure 7:
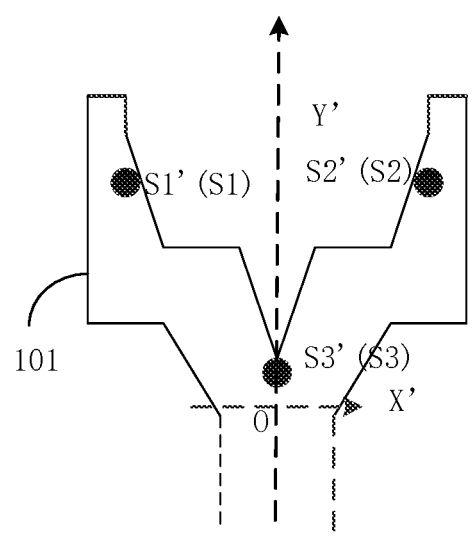
FIG. 7 is a top view illustrating the robot fork according to another embodiment of the present invention.

Please referring to FIG. 7, in a preferred embodiment, three upper sensors S1', S2' and S3' are fixed on the top surface of the fork at positions corresponding to the lower sensors. The upper sensors are also optical sensors. When the calibrated fork moves between the waypoints P1 and P2 before picking up or after placing the target wafer, the upper sensors S1', S2' and S3' emit parallel lights to detect distances to the target wafer. The calculate module 504 calculates spatial coordinates of three light incident points on the target wafer in the local coordinate system to be $(x_1', y_1', z_1')$, $(x_2', y_2', z_2')$ and $(x_3', y_3', z_3')$.

Based on these spatial coordinates $(x_1', y_1', z_1')$, $(x_2', y_2', z_2')$ and $(x_3', y_3', z_3')$, a plane equation of the target wafer is acquired by the calculate module 504 as $a'X+b'Y+c'Z+d'=0$; wherein, the terms a', b', c' and d' are calculated as follows:

$$a' = y_1'z_2' - y_1'z_3' - y_2'z_1' + y_2'z_3' + y_3'z_1' - y_3'z_2'$$

$$b' = -x_1'z_2' + x_1'z_3' + x_2'z_1' - x_2'z_3' - x_3'z_1' + x_3'z_2'$$

$$c' = x_1'y_2' - x_1'y_3' - x_2'y_1' + x_2'y_3' + x_3'y_1' - x_3'y_2',$$

$$d' = -x_1'y_2'z_3' + x_1'y_3'z_2' + x_2'y_1'z_3' - x_2'y_3'z_1' - x_3'y_1'z_2' + x_3'y_2'z_1'.$$

Then, the angle $\theta'$ between the plane of the target wafer and the X' OY' local plane, which is the tilted angle of the target wafer relative to the calibrated fork, meets the following equation:

$$\cos\theta' = c'/[\sqrt{(a'^2+b'^2+c'^2)}]$$

$$\theta' = \arccos(c'/[\sqrt{(a'^2+b'^2+c'^2)}]).$$

In the case where the target wafer is tilted, the static friction force must counteract the component of the gravity force that acts along the interface between the target wafer and the supporters. Taking the limiting case that the target wafer is inclined by a limit angle $\delta$ that the component of the force of gravity is equal to the maximum value of the force of static friction, just before the target wafer begins to slide, the limit angle $\delta$ satisfies the relationship of:

$$mg\sin(\delta) - \mu mg\cos(\delta) = 0$$

Therefore, the tangent of the limit angle $\delta$ is equal to the coefficient $\mu$ of the static friction:

$$\delta = \arctan(\mu).$$

Accordingly, the tilted angle $\theta'$ of the target wafer should be smaller than or equal to the limit angle $\delta$, which can be represented as $\theta' \leq \arctan(\mu)$.

The control module 505 compares the tilted angle $\theta'$ calculated by the calculate module 504 with the limit angle $\delta$ and determines whether the target wafer will slide off the supporters. If the tilted angle $\theta'$ exceeds the limit angle $\delta$, the control module 505 instructs the drive module 503 to stop the robot and alert an alarm.

Furthermore, during the pick-up operation, in the case where the target wafer is tilted, the lowest end of the target wafer may collide with the robot when the robot enters into the wafer carrier, while the highest end of the target wafer may be higher than the waypoint P4, which causes failure of the pick-up operation. Therefore, in another preferred embodiment, the calculate module 504 calculates the minimum distance between the target wafer and the fork as well as the maximum distance between the target wafer and the fork according to the vertical distances detected by the upper sensors S1'-S3' when the robot moves between the waypoints P1 and P2. Specifically, as mentioned above, the plane equation of the target wafer is acquired as $a'X+b'Y+c'Z+d'=0$, thus the distance Z between any point on the target wafer and the fork satisfies the following relationship:

$$Z = (-d' - a'X - b'Y)/c', \quad \left(\frac{X}{R\cos\theta'}\right)^2 + \left(\frac{Y}{R}\right)^2 = 1$$

wherein R is the radius of the target wafer.

The calculate module 504 solves the above equation by a differential method to obtain the minimum distance Zmin and maximum distance Zmax.

Then the control module 505 compares the minimum distance Zmin with a limit distance between the target wafer and the fork, if the minimum distance Zmin is less than the limit distance, the control module instructs the drive module to stop the robot. The determine module 505 also compares the maximum value Zmax with the offline teaching data S3, if Zmax>S3, which means that the robot cannot touch the target wafer during the pick-up operation, the control module also instructs the drive module to stop the robot.

From above, after the fork pose calibration, the upper sensors fixed on the fork are utilized to detect the distance between the fork and the target wafer such that the calculate module can calculate the inclined angle of the target wafer relative to the fork as well as the minimum and maximum distances between the target wafer and the fork, thus to determine whether the wafer will slip off or collide with the fork. If collision or wafer slippery may occur, the robot is controlled to stop. Therefore, wafer damages due to unexpected contact between the fork and the wafer can be avoided, wafer handling safety can be improved.

While the invention has been particularly shown and described with references to preferred embodiments thereof, if will be understood by those skilled in the art that various changes in form and details may be made herein without departing from the spirit and scope of the invention as defined by the appended claims.

The invention claimed is:
1. A method for calibrating a fork of a robot, wherein the fork is used for picking up and placing a target wafer in a wafer carrier and is mounted on a fixed base station, the method comprising:
   setting a detection point on a horizontal upper surface of the base station and establishing a reference coordinate system in which the detection point is the zero point, the horizontal upper surface is the XOY plane;
   providing at least three non-linear arranged lower sensors on a bottom surface of the fork or a bottom surface of a dummy wafer fixed on the fork at regions uncovered by the fork for detecting distances to the detection point;
   programming the robot in accordance with offline teaching data including a sequence of waypoints which define a pick-up operation path or a place operation path of the target wafer;
   driving the robot to move along the pick-up operation path or the place operation path of the target wafer, wherein at each waypoint, acquiring spatial coordinates of the lower sensors in the reference coordinate system according to detection results from the lower sensors and then calculating a plane equation of the fork and a tilted angle of the fork according to the spatial coordinates of the lower sensors;
   calibrating a height of the fork according to vertical distances between the lower sensors and the horizontal upper surface and calibrating a levelness of the fork according to the tilted angle of the fork.

2. The method according to claim 1, the step of calibrating a height of the fork according to vertical distances between the lower sensors and the horizontal upper surface comprises:
   determining whether the vertical distances between the lower sensors and the horizontal upper surface are all within a first predetermined range at a current waypoint;
   if yes, calculating a current average value of the vertical distances and calculating a variation between the current average value and a previous average value of the vertical distances at the same waypoint;
   calibrating the height of the fork by the variation.

3. The method according to claim 2, wherein the first predetermined range is from a first threshold value to a second threshold value; if at least one vertical distance is greater than the second threshold value, stopping the robot and alerting an alarm.

4. The method according to claim 1, the step of calibrating a levelness of the fork according to the tilted angle of the fork comprises:
   determining whether the tilted angle is within a second predetermined range, if no, calibrating the levelness of the fork as follows:
   obtaining a rotation matrix converting a local coordinate system defined by the plane of the fork into the reference coordinate system by using unit quaternions according to the tilted angle and the plane equation of the fork;
   representing the rotation matrix by Euler angles;
   solving the Euler angles according to the unit quaternions;
   rotating the fork around its axes by the Euler angles respectively.

5. The method according to claim 4, wherein after calibrating the levelness of the fork, further comprising:
   determining whether the distances between the lower sensors and the horizontal upper surface are all within the first predetermined range at a current waypoint;
   if yes, calibrating the height of the fork.

6. The method according to claim 1, wherein, the lower sensors are arranged on the bottom surface of the fork.

7. The method according to claim 6, wherein the method is performed on-line during a wafer pick-an-place operation and further comprises the step of providing at least three non-linear arranged upper sensors on a top surface of the fork;
   wherein before the fork picking up or after the fork placing the target wafer, during a period when the fork moves from a waypoint after being calibrated to a next waypoint, detecting distances between the upper sensors and the target wafer and calculating an inclined angle of the target wafer relative to the fork;
   determining whether the inclined angle exceeds a limit angle, if yes, stopping the robot.

8. The method according to claim 7, if the inclined angle is less than or equal to the limit angle, calculating a maximum distance and a minimum distance between the target wafer and the fork;
   determining whether the maximum distance is greater than a first preset value and whether the minimum distance is less than a second preset value;
   if either one is yes, stopping the robot.

9. A system for calibrating a fork of a robot, wherein the fork is mounted on a fixed base station for picking up and placing a target wafer in a wafer carrier, the system comprising:
   at least three non-linear arranged lower sensors arranged on a bottom surface of the fork or a bottom surface of a dummy wafer fixed on the fork at regions uncovered by the fork for detecting a distance between the fork and a detection point on a horizontal upper surface of the base station;
   a store module storing offline teaching data including a sequence of waypoints which define a pick-up operation path or a place operation path of the target wafer;
   a drive module driving the robot to move along the pick-up operation path or the place operation path of the target wafer and driving each lower sensor to detect when the robot arrives at each waypoint;
   a calculate module calculating spatial coordinates of the lower sensors in a reference coordinate system in which the detection point is the zero point and the horizontal upper surface of the base station is the XOY plane according to detection results from the lower sensors and then calculating a plane equation of the fork and a tilted angle of the fork according to the spatial coordinates of the lower sensors;
   a control module controlling the drive module to calibrate a height of the fork according to vertical distances of the lower sensors to the horizontal upper surface and a levelness of the fork according to the tilted angle.

10. The system according to claim 9, wherein the control module determines whether the vertical distances between the lower sensors and the horizontal upper surface are all within a first predetermined range at a current waypoint;
    if yes, the calculate module calculates a current average value of the vertical distances and calculates a variation between the current average value and a previous average value of the vertical distances at the same waypoint;
    the drive module calibrates the height of the fork by the variation.

11. The system according to claim 10, wherein the first predetermined range is from a first threshold value to a second threshold value; if at least one vertical distance is greater than the second threshold value, the drive module stops the robot and alerts an alarm.

12. The system according to claim 9, wherein the control module determines whether the tilted angle is within a second predetermined range;
if no, the calculate module obtains a rotation matrix converting a local coordinate system defined by the plane of the fork into the reference coordinate system by using unit quaternions according to the tilted angle and the plane equation of the fork; the calculate module further represents the rotation matrix by Euler angles and solves the Euler angles according to the unit quaternions; the drive module rotates the fork around its axes by the Euler angles respectively.

13. The system according to claim 12, wherein after calibration of the levelness of the fork, the control module determines whether the distances between the lower sensors and the horizontal upper surface are all within the first predetermined range at a current waypoint; if yes, the control module controls the drive module to calibrate the height of the fork.

14. A wafer pick-and-place system for picking up and placing a target wafer in a wafer carrier comprising:
a robot having a fork which is mounted on a fixed base station;
at least three non-linear arranged upper sensors fixed on a top surface of the fork for detecting distances to the target wafer;
at least three non-linear arranged lower sensors fixed on a bottom surface for detecting distances to a detection point on a horizontal upper surface of the base station;
a store module storing offline teaching data including a sequence of waypoints which define a pick-up operation path or a place operation path of the target wafer;
a drive module driving the robot to move along the pick-up operation path or the place operation path of the target wafer and driving the upper sensors and the lower sensors to detect;
a calculate module calculating spatial coordinates of the lower sensors in a reference coordinate system in which the detection point is the zero point and the horizontal upper surface of the base station is the XOY plane according to detection results from the lower sensors and then calculating a plane equation of the fork and a tilted angle of the fork according to the spatial coordinates of the lower sensors;
a control module controlling the drive module to calibrate a height of the fork according to vertical distances of the lower sensors to the horizontal upper surface and a levelness of the fork according to the tilted angle.

15. The wafer pick-and-place system according to claim 14, wherein the control module determines whether the vertical distances between the lower sensors and the horizontal upper surface are all within a first predetermined range at a current waypoint;
if yes, the calculate module calculates a current average value of the vertical distances and calculates a variation between the current average value and a previous average value of the vertical distances at the same waypoint;
the drive module calibrates the height of the fork by the variation.

16. The wafer pick-and-place system according to claim 15, wherein the first predetermined range is from a first threshold value to a second threshold value; if at least one vertical distance is greater than the second threshold value, the drive module stops the robot and alerts an alarm.

17. The wafer pick-and-place system according to claim 14, wherein the control module determines whether the tilted angle is within a second predetermined range;
if no, the calculate module obtains a rotation matrix converting a local coordinate system defined by the plane of the fork into the reference coordinate system by using unit quaternions according to the tilted angle and the plane equation of the fork; the calculate module further represents the rotation matrix by Euler angles and solves the Euler angles according to the unit quaternions; the drive module rotates the fork around its axes by the Euler angles respectively.

18. The wafer pick-and-place system according to claim 17, wherein after calibration of the levelness of the fork, the control module determines whether the distances between the lower sensors and the horizontal upper surface are all within the first predetermined range at a current waypoint; if yes, the control module controls the drive module to calibrate the height of the fork.

19. The wafer pick-and-place system according to claim 14, wherein before the fork picking up or after the fork placing the target wafer, during a period when the fork moves from a waypoint after being calibrated to a next waypoint, the upper sensors detect distances to the target wafer and the calculate module calculates an inclined angle of the target wafer relative to the fork; the control module determines whether the inclined angle exceeds a limit angle, if yes, the drive module stops the robot.

20. The wafer pick-and-place system according to claim 19, if the control module determines that the inclined angle is less than or equal to the limit angle, the calculate module calculates a maximum distance and a minimum distance between the target wafer and the fork; the control module determines whether the maximum distance is greater than a first preset value and whether the minimum distance is less than a second preset value; if either one is yes, the drive module stops the robot.

* * * * *